United States Patent [19]

Slemmer

[11] Patent Number: 5,648,933
[45] Date of Patent: *Jul. 15, 1997

[54] STRUCTURE FOR DESELECTING BROKEN SELECT LINES IN MEMORY ARRAYS

[75] Inventor: William Carl Slemmer, Dallas, Tex.

[73] Assignee: SGS-Thomson Microelectronics, Inc., Carrollton, Tex.

[*] Notice: The term of this patent shall not extend beyond the expiration date of Pat. No. 5,465,233.

[21] Appl. No.: 509,211

[22] Filed: Jul. 31, 1995

Related U.S. Application Data

[63] Continuation-in-part of Ser. No. 69,025, May 28, 1993, Pat. No. 5,465,233.
[51] Int. Cl.$^6$ .................................................. G11C 7/00
[52] U.S. Cl. ........................ 365/200; 365/63; 365/72
[58] Field of Search ...................... 365/230.01, 230.06, 365/200, 63, 72, 149

[56] References Cited

U.S. PATENT DOCUMENTS

| | | | |
|---|---|---|---|
| 4,760,559 | 7/1988 | Hidaka et al. | 365/189.11 |
| 4,905,194 | 2/1990 | Ohtsuka et al. | 365/230.06 |
| 5,161,121 | 11/1992 | Cho | 365/189.06 |
| 5,465,233 | 11/1995 | Slemmer | 365/200 |

*Primary Examiner*—Son T. Dinh
*Attorney, Agent, or Firm*—Theodore E. Galanthay; Lisa K. Jorgenson; Renee M. Larson

[57] ABSTRACT

According to the present invention, a structure for holding broken select lines in a memory array deselected addresses the prior art problems associated with floating broken select lines, such as standby current and disruption of attached memory cells. The structure is a non-linear, high impedance device which is placed on the end of select lines so that if a select line is broken during fabrication, the non-linear, high impedance device will hold the broken end of the select line to the desired deselect voltage. Select lines which have a driver at one end only and are broken during fabrication, but have the non-linear, high impedance device on the other end, are not allowed to float. The non-linear, high impedance device is also suitable for select lines which are not broken and previously were anchored at just one end. Suitable non-linear, high impedance devices include a reverse biased diode, a weak transistor, a bulk transistor, a poly R memory cell load device, an ON or OFF TFT memory cell load device, or other transistor structures. Additionally, the use of non-linear devices, such as transistor structures, provides the advantage of a compact layout structure that is especially suitable for high density integrated circuit memory devices.

24 Claims, 5 Drawing Sheets

STRUCTURE FOR DESELECTING BROKEN SELECT LINES IN MEMORY ARRAYS

This application is a continuation-in-part application of U.S. patent application Ser. No. 08/069,025 (Docket No. 93-C-13), filed May 28, 1993 U.S. Pat. No. 5,465,233, assigned to SGS-Thomson Microelectronics, Inc. and incorporated herein by reference.

BACKGROUND OF THE INVENTION

1. Field of the Invention

The present invention relates generally to integrated circuit memory devices, and more specifically to a structure for deselecting broken select lines in memory arrays.

2. Background of the Invention

Many memory devices with a redundancy scheme have broken select lines in the memory array. Memory devices that are subject to broken select lines include static random access memories (SRAMs), erasable programmable read only memories (EPROMs), electrically erasable read only memories (EEPROMs), Flash EEPROMs, and other specialty memory devices such as tag RAMs and Zeropower® devices. A recent trend in the memory device field is to use more redundancy as the density of such devices increases. As the density of memory devices having broken select lines increases, problems associated with these broken select lines increase as well.

In SRAM technology, the select lines for a memory array are connected to a large number of memory cells, or local row decoders, in the array. Typical select lines may include a row line, a master row line, a word line, or an X-Line. These lines select, in a parallel fashion, the memory cells or local row decoders necessary to access a particular portion of the memory array. When that portion of the memory array is not to be selected, the select lines are held in a deselect state to disable all connected cells or local row decoders.

In the DRAM prior art, word select lines perform the same function as outlined above. Word lines are held at a low logic level at both ends by devices, often called holding devices, which are capable of maintaining this low logic level on unselected word lines in the presence of strong capacitive coupling from a selected word line and from bit lines—half or more of which have positive-going transitions during the cycle. DRAM row lines are high impedance such that a holding transistor placed on one end of the row line is not sufficient to hold the entire length of the row line in a deselected state. A quite word flip-flop or other deselect scheme is often used to provide clamping means which prevent bouncing of word lines or row lines. Later improvements in the development of DRAMs provided precharge, such as $V_{cc}/2$, that balances this coupling for selection, separation and equilibration of bitlines to the word lines, thus making holding devices less important.

In contrast, traditionally the number of SRAM bit lines driven during any given cycle is small, so that problems are not encountered with coupling of these bit lines to the word lines in the memory array. Thus, select lines have been held deselected at one end only, and holding devices have not been needed on both ends of a SRAM select line. However, there can be a problem with sections of broken select lines in the memory array. When the array is repaired by substituting spare or redundant elements for broken select lines, the end of each of these broken select lines near the driver is held deselected, but the far end of a broken select line may not be held deselected and may float. Floating broken select lines may drift in a selected direction, causing high standby current, and, in extreme cases, of may produce enough bit line current from connected cells to disrupt the operation of some of the connected bit lines. Unlike the DRAM, however, there is no strong coupling which drives these lines positive.

Therefore, it would be desirable in the art to prevent the charging of floating select lines in memory arrays with little or no adverse effect on the speed or selection of select lines. Prevention of high standby current or bitline current is especially desirable as memory devices become more dense and use more redundancy. Additionally, it would be desirable in the art that any approach taken to prevent the charging of floating select lines in memory arrays use as little additional layout area as possible. This is especially desirable as memory devices become more dense.

SUMMARY OF THE INVENTION

It is an object of the present invention to prevent the charging of floating select lines in memory arrays with little or no adverse effect on the speed or selection of select lines.

It is further an object of the present invention to prevent the charging of floating select lines in memory arrays using as little additional layout area as possible.

Therefore, according to the present invention, a structure for holding broken select lines in a memory array deselected addresses the prior art problems associated with floating broken select lines, such as standby current and disruption of attached memory cells. The structure is a non-linear, high impedance device which is placed on the end of select lines so that if a select line is broken during fabrication, the non-linear, high impedance device will hold the broken end of the select line to the desired deselect voltage. Select lines which have a driver at one end only and are broken during fabrication, but have the non-linear, high impedance device on the other end, are not allowed to float. The non-linear, high impedance device is also suitable for select lines which are not broken and previously were anchored at just one end. Suitable non-linear, high impedance devices include a reverse biased diode, a weak transistor, a bulk transistor, a poly R memory cell load device, an ON or OFF TFT memory cell load device, or other transistor structures. Additionally, the use of non-linear devices, such as transistor structures, provides the advantage of a compact layout structure that is especially suitable for high density integrated circuit memory devices.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

In SRAM technology, select lines in a memory array are connected to a large number of memory cells, or local row decoders, in the array. Typical select lines may be a row line, a master row line, a word line, or an X-Line. These lines select, in a parallel fashion, the memory cells or local row decoders necessary to access a particular portion of the memory array. When that portion of the memory array is not to be selected, the select lines are held in a deselect state to disable all connected cells or local row decoders.

Figure 1:
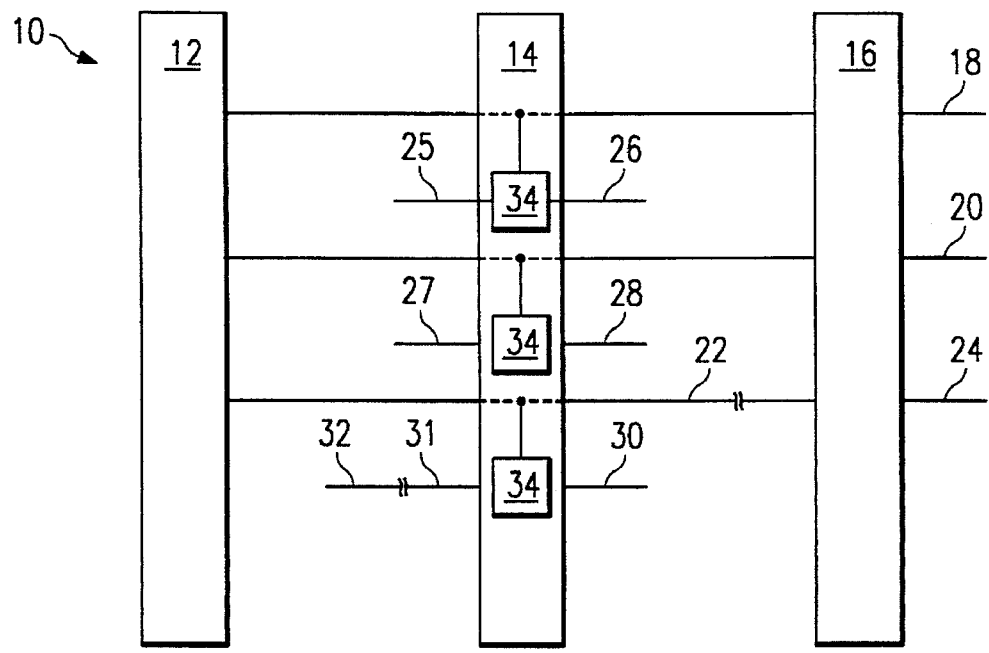
FIG. 1 is a schematic diagram of select lines in a portion of a memory array according to the prior art.

Referring to FIG. 1, a schematic diagram of select lines in a portion of a memory array 10 according to the prior art is shown. Master row decode logic block 12 is connected to local row decode logic blocks 14 and 16 through master row select lines 18, 20, and 22, which are in turn connected to one or more local row decode logic and driver circuitry 34 inside local row decode logic blocks 14 and 16 as shown. Master row select lines 18, 20, and 22 are held deselected at the end connected to the master row decode logic block 12 by a driver inside master row decode logic 12. However, broken master row select line 24, which was intended to be deselected by deselecting master row select line 22 and substituting a spare or redundant element, is left floating. A floating select line, such as broken master row select line 24, is undesirable, because it may float to the selected state causing high standby current. In extreme cases, a floating broken select line may produce enough bit line current to disrupt operation of the memory array.

Also shown in FIG. 1 are word select lines 25, 26, 27, 28, 30, 31, and 32. Word lines 25, 26, 27, 28, 30 and 31 are each held deselected at one end by local word line decoder logic and driver circuitry 34 in a manner similar to how master row select lines 18, 20, 22 are held deselected. Floating broken word select line 32 is analogous to floating broken master row select line 24. It too may have been deselected and replaced by a spare or redundant element to repair the memory array. Like broken master row select line 24, broken word select line 32 may cause standby current problems or interfere with the operation of the memory array.

In the DRAM prior ad, word select lines are held at a low logic level at both ends by devices, often called holding devices, which are capable of maintaining this low logic level on unselected word lines in the presence of strong capacitive coupling from a selected word line and from bit lines—half or more of which have positive-going transitions during the cycle. DRAM row lines have high impedance such that a holding transistor placed on one end of the row line is not sufficient to hold the entire length of the row line in a deselected state. A quite word flip-flop or other deselect scheme is often used to provide clamping means which prevent bouncing of word lines or row lines.

Figure 2:
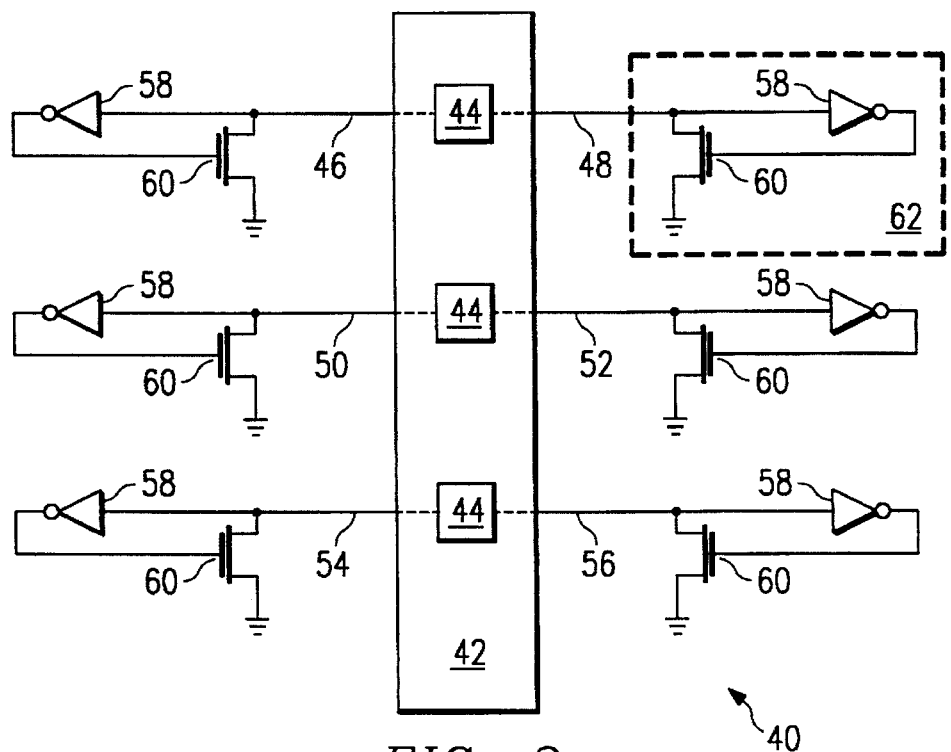
FIG. 2 is a schematic diagram of a quite word flip flop in a portion of a dynamic random access memory (DRAM) array according to the prior art.

Referring to FIG. 2, a schematic diagram 40 of a quite word flip flop in a portion of a DRAM array according to the prior art is shown. Row decode logic block 42 contains row decode logic and driver circuitry 44 which functions to hold deselected one end of word lines 46, 48, 50, 52, 54, and 56. Quite word flip-flop circuitry 62 is comprised of inverter 58 and transistor 60, and provides clamping means which prevent the bouncing of word lines to which they are attached. When row decode logic and driver circuitry 44 drives low, quite word flip-flop circuitry 62 ensures that the end of the word line opposite row decode logic and driver circuitry 44 is also held low. When row decode logic and driver circuitry 44 drives high, the trip point of inverter 58 is passed. The output signal of inverter 58 is connected back to the gate of transistor 60, causing transistor 60 to turn off. As is well known in the art, the inverter function provided by inverter 58 could also be provided by two transistors properly connected.

While the quite word flip-flop 62 of FIG. 2 is an effective solution to bouncing word lines in DRAMs, broken select lines in SRAMs beg a different approach. To prevent the charging of floating select lines, a high impedance device can be placed at the floating end of the select lines. This high impedance device can be a variety of devices, including non-linear devices such as a reverse biased diode, a poly R memory cell load device, a weak transistor, a bulk transistor, a depletion transistor, an ON or OFF thin film technology (TFT) memory cell load device, and a reverse biased diode. All of these non-linear devices may be sufficient to hold the floating end of a broken select line deselected. The high impedance, non-linear device should leak charge, pulling the floating line toward the deselect voltage, but have enough impedance to have little or no effect on the speed or level of selection on normal select lines. These high impedance non-linear devices may also be suitable on normal select lines where the voltage level of the select line is boosted and subjected to discharge, without the need to use the quite word flip-flop deselect clamping scheme employed in DRAMs.

Figure 3:
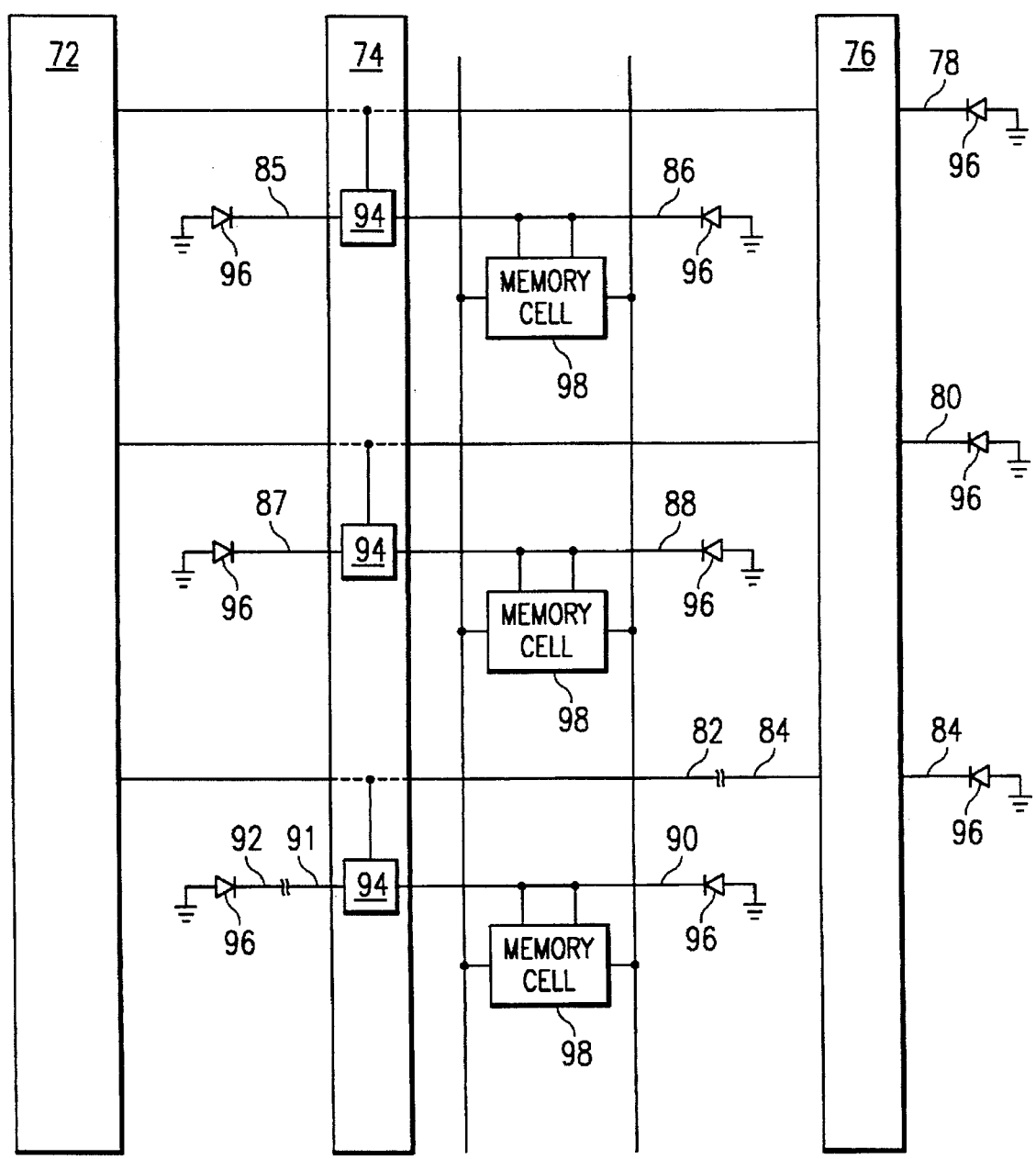
FIG. 3 is a schematic diagram of broken select lines in a portion of a memory array being held to a desired deselect voltage by high impedance devices, according to a first preferred embodiment of the present invention.

Referring to FIG. 3, a schematic diagram of select lines in a portion of a memory array 70 according to the present invention is shown. Memory cells 98 are connected to select lines 86, 88, and 90 as shown. In order to prevent the ends of master row select lines 78, 80, 84 and word select lines 85, 86, 87, 88, 90, and 92 from floating, high impedance reverse biased diodes 96 are placed at the ends of these select lines. The high impedance reverse biased diodes 96 present on broken master row select line 84 and broken word select line 92 ensure that these broken select lines can be held deselected and will not randomly float. Additionally, high impedance reverse biased diodes 96 help to hold both ends of master row select lines 78, 80 and word select lines 85, 86, 87, 88, and 90 to the desired deselect voltage. A reverse biased diode may be used because the charging currents on a broken select line segment in an SRAM memory array are very small. Thus, reverse biased diodes 96 are used because the currents required for deselecting the broken select line segment is very small. The impedance of reverse biased diodes 96 is carefully chosen to ensure the presence of leakage charge, which pulls the floating select lines toward the proper deselect voltage level, but with a high enough impedance value so as to have little or no effect on the speed or level of selection on normal select lines.

Figure 4:
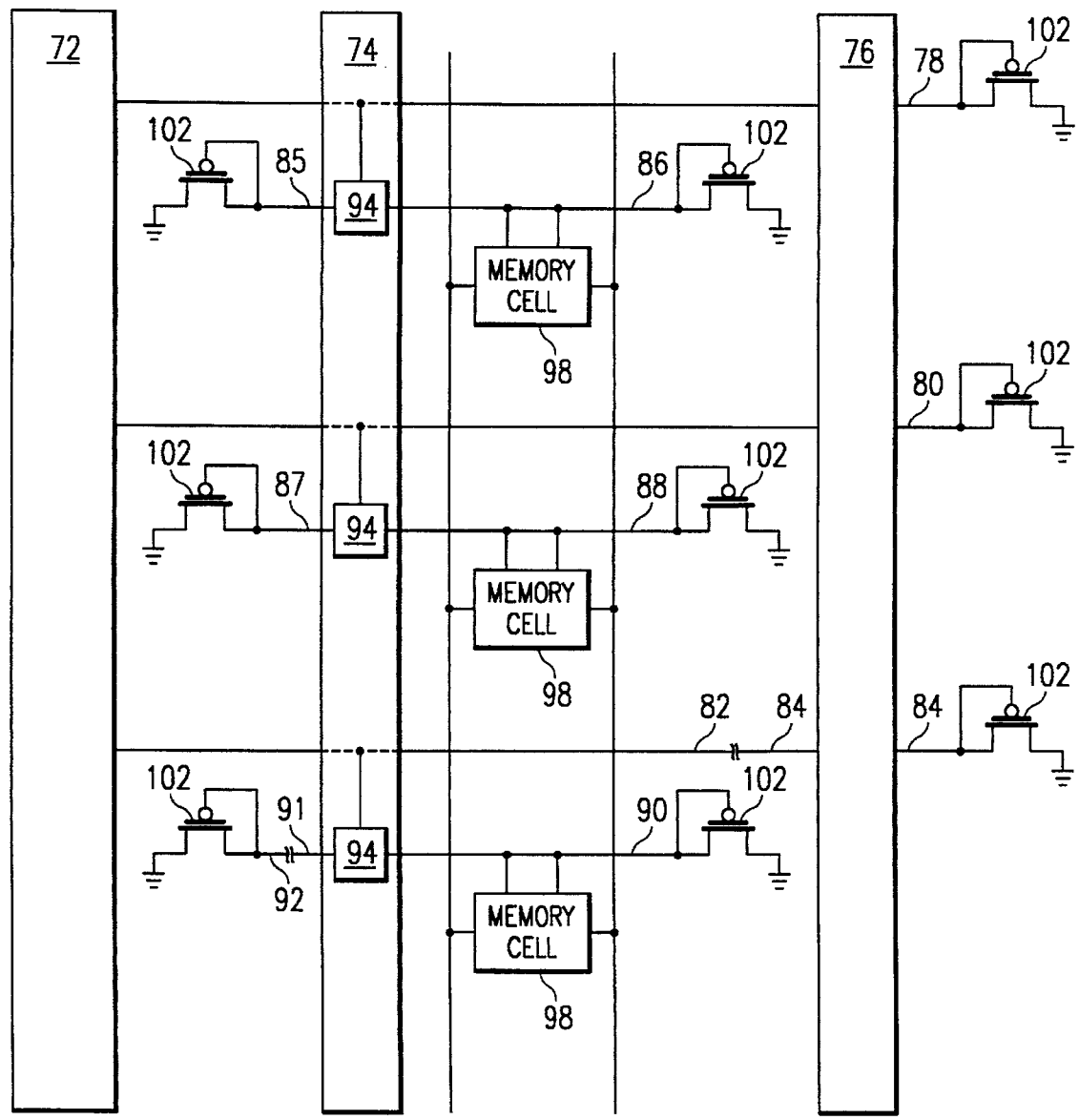
FIG. 4 is a schematic diagram of broken select lines in a portion of a memory array being held to a desired deselect voltage by non-linear devices, according to a second preferred embodiment of the present invention.
Figure 5:
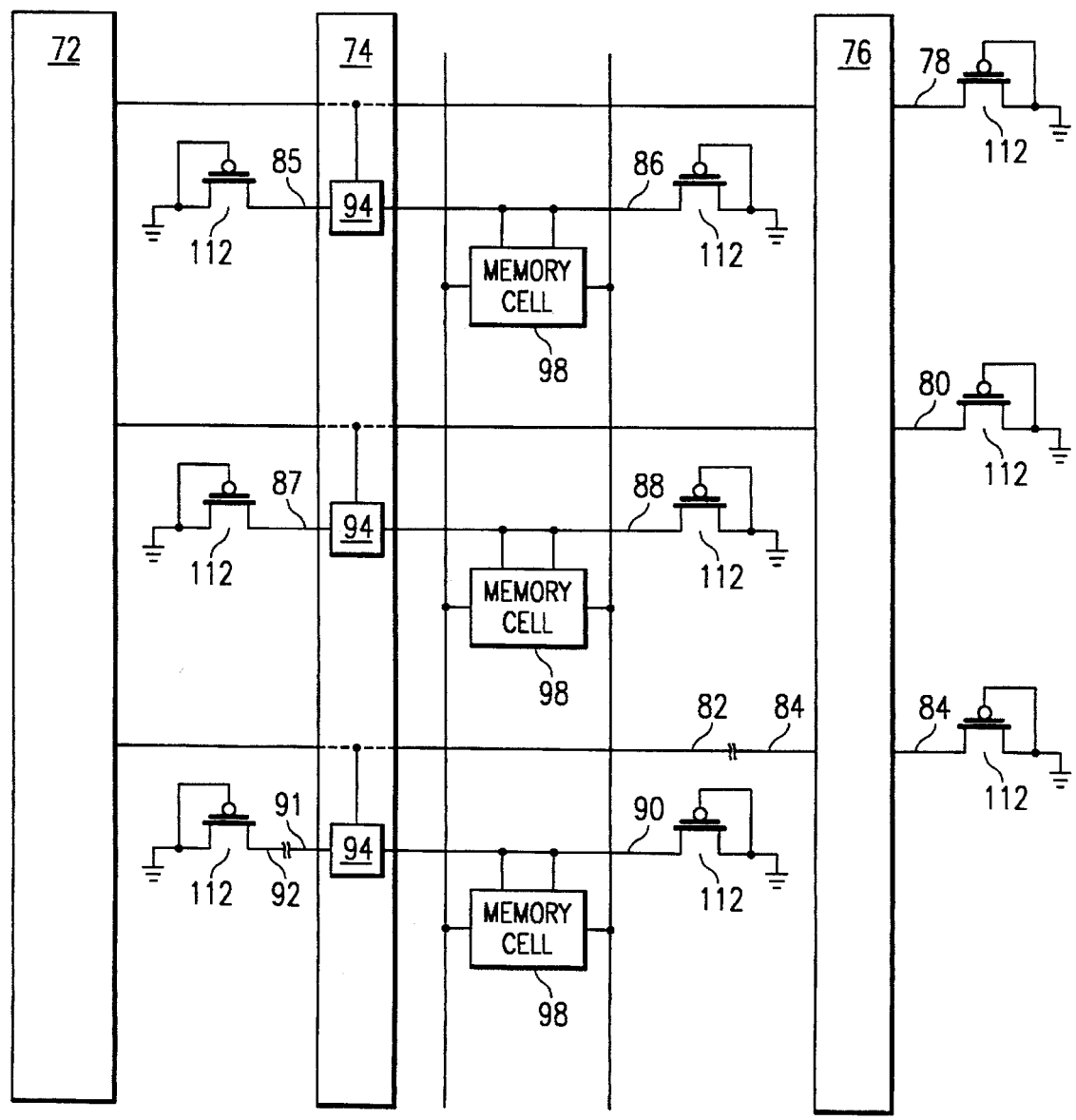
FIG. 5 is a schematic diagram of broken select lines in a portion of a memory array being held to a desired deselect voltage by non-linear devices, according to a third preferred embodiment of the present invention.
Figure 6:
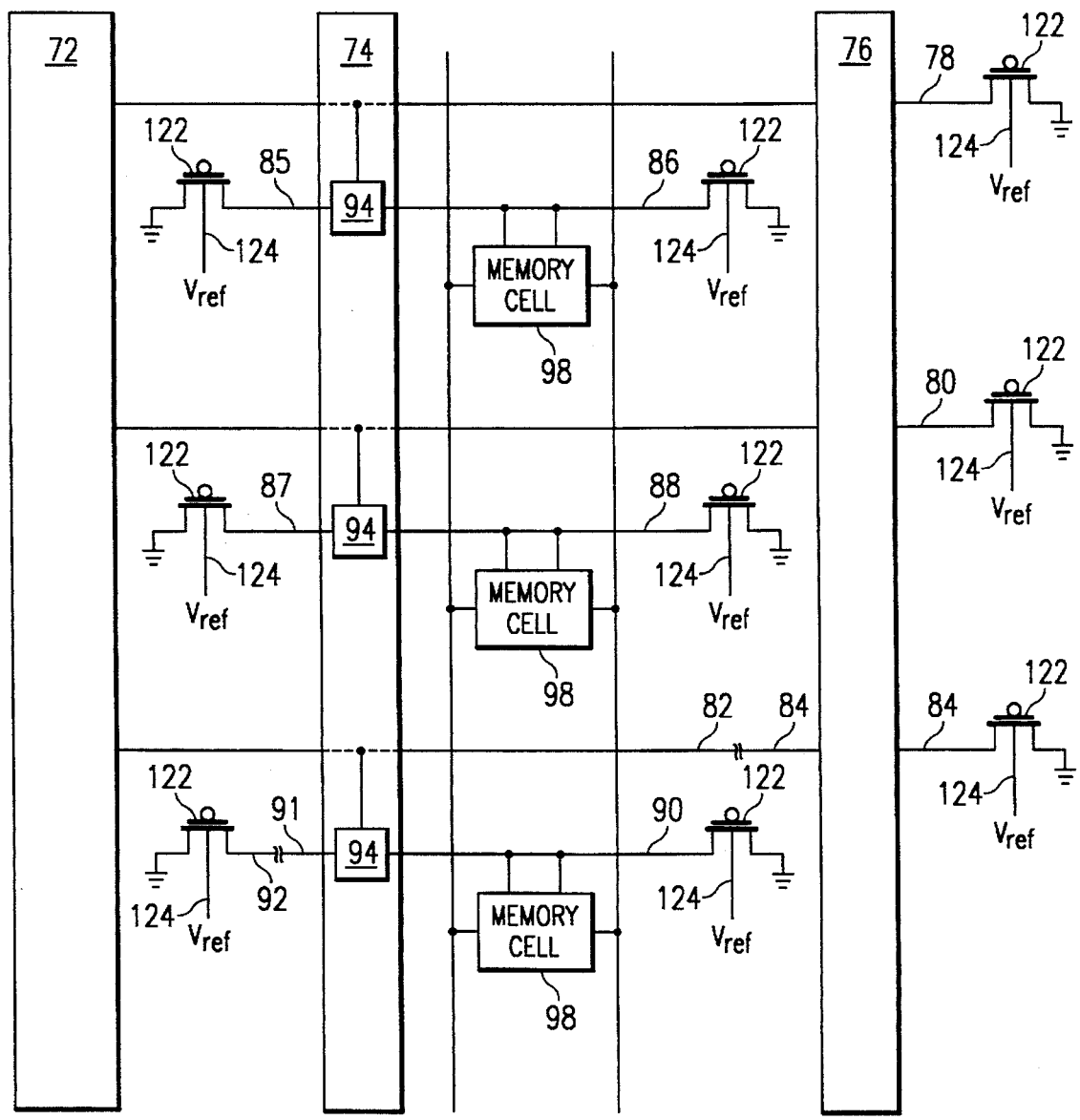
FIG. 6 is a schematic diagram of broken select lines in a portion of a memory array being held to a desired deselect voltage by non-linear devices, according to a fourth preferred embodiment of the present invention.

In addition to reverse biased diodes, a number of other non-linear, high impedance devices, notably transistors, may be used to hold the floating end of a broken select line deselected. A variety of transistor types, including a weak transistor, a bulk transistor, a depletion transistor, and an ON or OFF thin film transistor (TFT) memory cell load device. FIGS. 4, 5, and 6 show the use of transistors to hold the floating end of a broken select line deselected. It should be noted that while p-channel transistors are shown and described in FIGS. 4, 5, and 6, n-channel transistors could just as easily be used. P-channel transistors are shown because load devices within a static random access memory (SRAM) are typically p-channel.

Referring to FIG. 4, a schematic diagram of broken select lines in a portion of a memory array being held to a desired deselect voltage by non-linear transistor devices, according to a second preferred embodiment of the present invention, is shown. A portion of a memory array 100 has a number of non-linear, high impedance transistors 102 which are used to hold broken select lines to a deselect voltage. In order to prevent master row select lines 78, 80, 84 and word select lines 85, 86, 87, 88, 90, and 92 from floating, high impedance, non-linear transistors 102 are placed at the ends of these select lines. Transistors 102 present on broken master row select line 84 and broken word select line 92 ensure that these broken select lines can be held deselected and not randomly float. Additionally, transistors 102 hold both ends of master row select lines 78, 80 and word select lines 85, 86, 87, 88, and 90 to the desired deselect voltage. Each p-channel transistor 102 of FIG. 4 has its gate connected to the transistor source so that transistor 102 is nominally OFF, making it a high impedance, non-linear element. The fixed bias of this connection tends to give transistor 102 a constant current characteristic, so that the load it places on a selected row line of the memory array would be very small.

Referring to FIG. 5, a schematic diagram of broken select lines in a portion of a memory array being held to a desired deselect voltage by non-linear transistor devices, according to a third preferred embodiment of the present invention, is shown. A portion of a memory array 110 has a number of non-linear, high impedance transistors 112 which are used to hold broken select lines to a deselect voltage. In order to prevent master row select lines 78, 80, 84 and word select lines 85, 86, 87, 88, 90, and 92 from floating, high impedance, non-linear transistors 112 are placed at the ends of these select lines. Transistors 112 present on broken master row select line 84 and broken word select line 92 ensure that these broken select lines can be held deselected and not randomly float. Additionally, transistors 112 held to hold both ends of master row select lines 78, 80 and word select lines 85, 86, 87, 88, and 90 to the desired deselect voltage. Each p-channel transistor 112 of FIG. 5 has its gate connected to ground potential and thus draws more current than transistor 102 of FIG. 4. Thus, transistor 112 provide a pull-down capability to ground but operate as a lower impedance device than transistor 102 of FIG. 4.

Referring to FIG. 6, a schematic diagram of broken select lines in a portion of a memory array being held to a desired deselect voltage by non-linear transistor devices, according to a fourth preferred embodiment of the present invention, is shown. A portion of a memory array 120 has a number of non-linear, high impedance transistors 122 which are used to hold broken select lines to a deselect voltage. In order to prevent master row select lines 78, 80, 84 and word select lines 85, 86, 87, 88, 90, and 92 from floating, high impedance, non-linear transistors 122 are placed at the ends of these select lines. Transistors 122 present on broken master row select line 84 and broken word select line 92 ensure that these broken select lines can be held deselected and not randomly float. Additionally, transistors 122 held to hold both ends of master row select lines 78, 80 and word select lines 85, 86, 87, 88, and 90 to the desired deselect voltage.

Each p-channel transistor 122 of FIG. 6 has a drain connected to ground potential and a gate driven by a common bias line reference voltage, designated as Vref. Vref is a fixed voltage reference. Thus, transistors 122 of FIG. 6 are similar to transistors 112 of FIG. 5 in that the gate of each transistor is connected or tied to a fixed voltage; in FIG. 5, the fixed voltage was ground potential, whereas in FIG. 6 the fixed voltage is Vref. Vref could be equal to ground potential, to a positive voltage, or Vref could be pumped to a negative bias to keep transistors 122 turned ON.

While transistors 102, 112, and 122 of FIGS. 4, 5, and 6, respectively, are connected to ground potential in keeping with a typical SRAM cell, it should be noted that the transistors could be connected to another voltage reference, such as Vcc. Also, while the transistors on master row select lines 78, 80, 84 and word select lines 85, 86, 87, 88, 90, and 92 are connected to the same voltage reference, i.e. ground potential, it is possible that the transistors connected to master row select lines 78, 80, 84 are tied to a first voltage reference, such as Vcc, while the transistors connected word select lines 85, 86, 87, 88, 90, and 92 are connected to a second voltage reference, such as ground potential. For instance, transistors connected to the end of broken master row select lines 78, 80, 84 could be n-channel transistors while the transistors connected to the end of broken word select lines 85, 86, 87, 88, 90 and 92 could be p-channel transistors, or vice-versa.

The transistors of FIGS. 4, 5, and 6 used to hold the floating end of a broken select line deselected are representative of a variety of transistors, including a weak transistor, a bulk transistor, a depletion transistor, and an ON or OFF thin film transistor (TFT) memory cell load device. Each of these transistor types offers their own inherent advantages. Generally speaking, the layout of non-linear transistor devices make contact with the active layer using a buried contact of a semiconductor device and thus offer the advantage of a very simple, compact layout structure. Thin film transistors, for instance, offer especially attractive layout advantages. They connect compactly directly to the polycrystalline silicon layer of a semiconductor device. They are not in the bulk of the semiconductor device and actually lie above the wordline. As such, TFTs are high impedance devices which can easily hold the floating end of a broken select line deselected. Additionally, TFTs are easy to contact and make use of existing pitch parameters of the semiconductor device. The choice of either an ON or OFF TFT memory cell load device depends on the parasitic coupling present; an ON TFT memory cell load device may be more attractive when more parasitic coupling is present and an OFF TFT memory cell load device may be more attractive when there is less parasitic coupling.

In addition to TFTs, transistors 102, 112, and 122 of FIGS. 4, 5, and 6 are representative of other types of transistors. A weak transistor does not offer as high an impedance value as a poly R memory cell load device or a reverse biased diode, but it does fit in compactly with the bias voltage on a semiconductor gate to offer a relatively high impedance value. Also, the compactness of a weak transistor offers obvious layout advantages. A depletion transistor may also be used. However, a depletion transistor typically requires additional process steps to fabricate. Just a few of the many transistor types represented by the transistors of FIGS. 4, 5, and 6 have been described. There are many other transistor types which may serve as high impedance, non-linear devices to hold the floating end of a broken select line deselected.

Many memory devices employ broken select lines in their memory arrays, including SPAMs, EPROMs, EEPROMs, and Flash EEPROMS. A structure for holding broken select lines in a memory array deselected has been shown. The use of such a structure addresses the prior art problems associated with floating broken select lines, such as standby current and disruption of the memory array. The structure is a high impedance device which is placed on select lines at the end of the select lines opposite the driver. Should a select line be broken and separated from the driver, the high impedance device holds the end opposite the driver to the desired deselect voltage. The high impedance device is also suitable for select lines which are not broken and previously were anchored at just one end. Suitable high impedance devices include a reverse biased diode, a weak transistor, a poly R memory cell load device, and an ON or OFF TFT memory cell load device.

While the invention has been particularly shown and described with reference to a preferred embodiment, it will be understood by those skilled in the art that various changes in form and detail may be made therein without departing from the spirit and scope of the invention.

What is claimed is:

1. Memory array circuitry for selecting a portion of a memory array, comprising:

a plurality of memory cells;

a plurality of select lines which select a portion of the memory cells in the memory array when set to a select voltage level and which deselect a portion of the memory array when set to a deselect voltage level, each select line having a first end and a second end, with the first end of the select line connected to a driver; and a plurality of non-linear devices, with a non-linear device of the plurality of non-linear devices connected to the second end of each of the select lines which holds the select line to the deselect voltage level if the select line is broken.

2. The circuitry of claim 1, wherein the non-linear device is a high impedance device.

3. The circuitry of claim 1, wherein the non-linear device is a transistor.

4. The circuitry of claim 3, wherein the transistor has a gate, a first terminal, and a second terminal, with the gate connected to the first terminal which is connected to the select line, and the second terminal connected to a voltage supply.

5. The circuitry of claim 3, wherein the transistor has a gate, a first terminal, and a second terminal, with the first terminal connected to the select line, and the gate connected to the second terminal which is connected to a voltage supply.

6. The circuitry of claim 3, wherein the transistor has a gate, a first terminal, and a second terminal, with the first terminal connected to the select line, the second terminal connected to a voltage supply, and the gate connected to a fixed voltage reference.

7. The circuitry of claim 3, wherein the non-linear device is a thin film transistor (TFT) memory cell load device.

8. The circuitry of claim 3, wherein the transistor is a high impedance device.

9. The circuitry of claim 3, wherein the non-linear device leaks charge, thereby pulling the select line, to which it is connected, to the deselect voltage level.

10. Memory array circuitry for selecting a portion of a memory array, comprising:

a plurality of local row decoders connected to a plurality of memory cells;

a plurality of select lines, both master row lines and word lines, connected to the local row decoders which select a portion of the memory array when set to a select voltage level and which deselect a portion of the memory array when set to a deselect voltage level, each select line having a first end and a second end, with the first end of the select line connected to a driver; and a plurality of non-linear devices, with a non-linear device of the plurality of non-linear devices connected to the second end of each of the select lines which holds the select line to the deselect voltage level if the select lines is broken.

11. The circuitry of claim 10, wherein the word lines are connected to the master row lines through at least one of a row decode logic and driver circuitry.

12. The circuitry of claim 11, wherein the master row lines are connected to at least one of a master row decode logic block which provides the driver on the first end of each of the master row lines.

13. The circuitry of claim 11, wherein the driver on the first end of each of the word lines is provided by the row decode logic and driver circuitry to which it is connected.

14. The circuitry of claim 10, wherein the plurality of non-linear devices are a plurality of high impedance devices.

15. The circuitry of claim 10, wherein the non-linear device leaks charge, thereby pulling the select line, to which it is connected, to the deselect voltage level.

16. The circuitry of claim 10, wherein the non-linear device is a transistor.

17. The circuitry of claim 16, wherein the transistor has a gate, a first terminal, and a second terminal, with the gate connected to the first terminal which is connected to the select line, and the second terminal connected to a voltage supply.

18. The circuitry of claim 16, wherein the transistor has a gate, a first terminal, and a second terminal, with the first terminal connected to the select line, and the gate connected to the second terminal which is connected to a voltage supply.

19. The circuitry of claim 16, wherein the transistor has a gate, a first terminal, and a second terminal, with the first terminal connected to the select line, the second terminal connected to a voltage supply, and the gate connected to a fixed voltage reference.

20. The circuitry of claim 16, wherein the non-linear device is a thin film transistor (TFT) memory cell load device.

21. The circuitry of claim 20, wherein the thin film transistor (TFT) memory cell load device is a high impedance device.

22. The circuitry of claim 16, wherein the transistor is a high impedance device.

23. Memory array circuitry for selecting a portion of a memory array, comprising:

a plurality of local row decoders connected to a plurality of memory cells;

a plurality of master row select lines, connected to the local row decoders which select a portion of the memory array when set to a select voltage level and which deselect a portion of the memory array when set to a deselect voltage level, each master row select line having a first end and a second end, with the first end of the master row select line connected to a first driver;

a plurality of word select lines, connected to the local row decoders which select a portion of the memory array when set to a select voltage level and which deselect a portion of the memory array when set to a deselect voltage level, each word select line having a first end and a second end, with the first end of the word select line connected to a second driver;

a plurality of first-type non-linear devices, with a first-type non-linear device of the plurality of first-type non-linear devices connected to the second end of each of the master row select lines which holds the master row select line to the deselect voltage level if the master row select line is broken; and a plurality of second-type non-linear devices, with a second-type non-linear device of the plurality of second-type non-linear devices connected to the second end of each of the word select lines which holds the word select line to the deselect voltage level if the word select line is broken.

24. The circuitry of claim 23, wherein the plurality of first-type non-linear devices is equal to the plurality of second-type non-linear devices.

* * * * *